United States Patent
Agata et al.

(10) Patent No.: US 12,317,560 B2
(45) Date of Patent: *May 27, 2025

(54) SEMICONDUCTOR DEVICE

(71) Applicant: FUJI ELECTRIC CO., LTD., Kanagawa (JP)

(72) Inventors: Yasunori Agata, Matsumoto (JP); Takashi Yoshimura, Matsumoto (JP); Hiroshi Takishita, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/660,198

(22) Filed: May 9, 2024

(65) Prior Publication Data

US 2024/0290845 A1    Aug. 29, 2024

Related U.S. Application Data

(63) Continuation of application No. 17/078,000, filed on Oct. 22, 2020, now Pat. No. 11,984,482, which is a
(Continued)

(30) Foreign Application Priority Data

Jan. 17, 2017    (JP) .................. 2017-006187

(51) Int. Cl.
*H10D 8/00*    (2025.01)
*H01L 21/265*    (2006.01)
(Continued)

(52) U.S. Cl.
CPC .......... *H10D 62/60* (2025.01); *H01L 21/265* (2013.01); *H10D 8/00* (2025.01); *H10D 8/411* (2025.01);
(Continued)

(58) Field of Classification Search
None
See application file for complete search history.

(56) References Cited

U.S. PATENT DOCUMENTS 10,797,045 B2    10/2020 Naito
2008/0001257 A1    1/2008 Schulze
(Continued)

FOREIGN PATENT DOCUMENTS

DE    112015006059 T5    10/2017
WO    0186712 A1    11/2001
(Continued)

OTHER PUBLICATIONS

International Search Report for International Patent Application No. PCT/JP2018/000886, issued by the Japan Patent Office on Mar. 27, 2018.
(Continued)

*Primary Examiner* — Michael Lebentritt

(57) ABSTRACT

A semiconductor device including a drift region and a buffer region is provided. The drift region of a first conductivity type is provided in a semiconductor substrate. The buffer region of the first conductivity type includes at least six peaks in a doping concentration distribution in a depth direction of the semiconductor substrate. A curve connecting the at least six peaks includes an upwardly-convex portion.

19 Claims, 13 Drawing Sheets

Related U.S. Application Data continuation of application No. 16/228,809, filed on Dec. 21, 2018, now Pat. No. 10,825,904, which is a continuation of application No. PCT/JP2018/000886, filed on Jan. 15, 2018.

(51) Int. Cl.
| | |
|---|---|
| *H10D 8/50* | (2025.01) |
| *H10D 12/00* | (2025.01) |
| *H10D 30/60* | (2025.01) |
| *H10D 62/17* | (2025.01) |
| *H10D 62/60* | (2025.01) |
| *H10D 84/40* | (2025.01) |
| *H10D 62/10* | (2025.01) |

(52) U.S. Cl.
CPC ............... *H10D 8/50* (2025.01); *H10D 12/00* (2025.01); *H10D 12/481* (2025.01); *H10D 30/60* (2025.01); *H10D 62/393* (2025.01); *H10D 84/406* (2025.01); *H10D 62/103* (2025.01)

(56) References Cited

U.S. PATENT DOCUMENTS

| | | | |
|---|---|---|---|
| 2010/0314660 A1* | 12/2010 | Salih | ............... H10D 8/25 257/E27.024 |
| 2015/0214347 A1 | 7/2015 | Falck | |
| 2016/0172438 A1 | 6/2016 | Jelinek | |
| 2016/0276446 A1 | 9/2016 | Wakimoto | |
| 2017/0278929 A1 | 9/2017 | Imagawa | |
| 2017/0352730 A1 | 12/2017 | Nakamura | |
| 2019/0148500 A1 | 5/2019 | Agata | |
| 2019/0148532 A1 | 5/2019 | Naito | |
| 2021/0043738 A1 | 2/2021 | Agata | |

FOREIGN PATENT DOCUMENTS

| | | | |
|---|---|---|---|
| WO | 2016051973 A1 | 4/2016 | |
| WO | 2016120999 A1 | 8/2016 | |
| WO | 2016204126 A1 | 12/2016 | |
| WO | WO-2018135448 A1 * | 7/2018 | ........... H01L 21/265 |

OTHER PUBLICATIONS

Those references were submitted as IDS or found by the examiner over the earlier U.S. Appl. No. 17/078,000, filed Oct. 22, 2020, and U.S. Appl. No. 17/078,000, filed Oct. 22, 2020.

Office Action issued for counterpart German Application 112018000050.8, transmitted from the German Patent and Trademark Office on Dec. 8, 2023 (issued on Dec. 5, 2023).

Concise Statement of Relevance: Partial translation of office action issued for counterpart German Application 112018000050.8, transmitted from the German Patent and Trademark Office on Dec. 8, 2023 (issued on Dec. 5, 2023).

* cited by examiner

SEMICONDUCTOR DEVICE

CROSS-REFERENCE TO RELATED APPLICATIONS

This application is a continuation of U.S. patent application Ser. No. 17/078,000, filed on Oct. 22, 2020, which is a continuation of U.S. patent application Ser. No. 16/228,809, filed on Dec. 21, 2018, which is a continuation of International Patent Application No. PCT/JP2018/000886, filed on Jan. 15, 2018, the entire contents of each of which are explicitly incorporated herein by reference. The application also claims priority from the Japanese patent application No. 2017-006187, filed on Jan. 17, 2017, the entire contents of which are also explicitly incorporated herein by reference.

BACKGROUND

1. Technical Field

The present invention relates to a semiconductor device.

2. Related Art

Conventionally, a semiconductor device in which a field stop region having a plurality of impurity concentration peaks is formed is known (for example, refer to Patent Documents 1 and 2).

PRIOR ART DOCUMENTS

Patent Documents

[Patent Document 1] U.S. Patent Application Publication No. 2016/0172438
[Patent Document 2] U.S. Patent Application Publication No. 2008/0001257

SUMMARY

Since the impurity concentrations of the respective peaks sequentially fall from the back surface side of the semiconductor substrate in the conventional field stop region, however, the conventional field stop layer may not satisfactorily serve as a field stop region that is designed to stop a depletion layer when the device characteristics are optimized.

A first aspect of the present invention may provide a semiconductor device including a semiconductor substrate of a first conductivity type;
   a drift layer of the first conductivity type provided in the semiconductor substrate; and
   a buffer region of the first conductivity type provided in the drift layer, the buffer region having a plurality of peaks of a doping concentration. The buffer region may have a first peak which has a predetermined doping concentration, and is provided the closest to a back surface of the semiconductor substrate among the plurality of peaks; and
   a high-concentration peak which has a higher doping concentration than the first peak, and is provided closer to an upper surface of the semiconductor substrate than the first peak is.
The buffer region may further have a low-concentration peak that has a lower doping concentration than the high-concentration peak and that is provided closer to the upper surface of the semiconductor substrate than the high-concentration peak is.

The high-concentration peak may be a second peak provided the second closest next to the first peak to the back surface of the semiconductor substrate among the plurality of peaks.

The second peak may have the highest concentration among the plurality of peaks.

The second peak may be provided at a position between 1 μm and 12 μm inclusive from the back surface of the semiconductor substrate.

A doping concentration of a doping concentration valley between the first peak and the second peak may be 10 times or more as high as a substrate concentration of the semiconductor substrate.

A doping concentration ratio $N_2/N_1$ of a doping concentration $N_2$ of the second peak to a doping concentration $N_1$ of the first peak may be $1 < N_2/N_1 \leq 100$.

The first peak may be a peak having the second highest concentration next to the second peak among the plurality of peaks.

The semiconductor substrate may have a doping concentration distribution in which a plurality of valleys are provided between the plurality of peaks, and doping concentrations of the plurality of valleys sequentially fall from a back surface side of the semiconductor substrate toward an upper surface side.

A ratio $(N_1/N_{V12})$ of a doping concentration $N_1$ of the first peak to a doping concentration $N_{V12}$ of a doping concentration valley between the first peak and the second peak may be higher than a ratio $(N_2/N_1)$ of a doping concentration $N_2$ of the second peak to the doping concentration $N_1$ of the first peak.

The semiconductor device may have a transistor section and a diode section. The diode section may have a floating layer of a second conductivity type that is different from the first conductivity type and the floating layer is closer to the back surface of the semiconductor substrate than the first peak is.

The semiconductor device may include a collector region of the second conductivity type at the back surface of the transistor section. Also, an integrated concentration from the collector region to the second peak may be higher than half of a critical integrated concentration of the semiconductor substrate.

The buffer region may further include a third peak provided the third closest next to the second peak to the back surface of the semiconductor substrate among the plurality of peaks. A doping concentration $N_3$ of the third peak may be lower than a doping concentration $N_{V12}$ of a doping concentration valley between the first peak and the second peak.

A distance $X_2 - X_1$ in a depth direction between the second peak and the first peak may be smaller than a depth $X_1$ from a back surface of the semiconductor substrate to the first peak.

A depth $X_0$ from the back surface of the semiconductor substrate to a boundary position between the first peak and the collector region may be smaller than a distance $X_1 - X_0$ in a depth direction between (i) the first peak and (ii) the boundary position between the first peak and the collector region.

A depth $X_0$ from the back surface of the semiconductor substrate to a boundary position between the first peak and the collector region may be larger than a distance $X_1 - X_0$ in a depth direction between (i) the first peak and (ii) the boundary position between the first peak and the collector region.

A distance $X_b$ from the back surface of the semiconductor substrate to a boundary position between the first peak and the floating layer may be smaller than a distance $X_1$-$X_b$ between (i) the first peak and (ii) the boundary position between the first peak and the floating layer.

A second aspect of the present invention provides a semiconductor device including a semiconductor substrate of a first conductivity type;
a drift layer of the first conductivity type provided in the semiconductor substrate; and
a buffer region of the first conductivity type provided in the drift layer, the buffer region having a plurality of peaks of a doping concentration. The plurality of peaks may include n peaks $P_n$ of a doping concentration distribution (n is an integer greater than or equal to 2). The semiconductor device may include a pair of a peak and a valley satisfying $NP_i/NB_{i+1} \leq 10$, where $NP_i$ denotes a doping concentration of an i-th peak $P_i$ of the peaks $P_n$ from a back surface of the semiconductor substrate and $NB_i$ denotes a doping concentration of a valley $B_i$ that is closer to the back surface of the semiconductor substrate than the i-th peak $P_i$ is.

The plurality of peaks may have a plurality of the pairs of a peak and a valley satisfying $NP_i/NB_{i+1} \leq 10$.

An envelope connecting all of doping concentrations $NB_i$ of valleys may attenuate from a valley $B_1$ to a valley $B_{n+1}$ exponentially or more moderately than an exponential function.

An envelope connecting all of doping concentrations $NB_i$ of valleys may attenuate convexly toward a side at which a doping concentration is smaller.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side in a direction parallel to a depth direction of a semiconductor substrate is referred to as "upper", and the other side is referred to as "lower". One of two principal surfaces of a substrate, a layer or some other member is referred to as an upper surface, and the other surface is referred to as a lower surface. The "upper", "lower", "front", and "back" directions are not limited to the gravitational direction or the direction of attachment to a substrate or the like at the time of mounting of a semiconductor device.

Although in each embodiment shown, the first conductivity type is N-type, and the second conductivity type is P-type, the first conductivity type may be P-type, and the second conductivity type may be N-type. In this case, conductivity types of substrates, layers, regions and the like in each embodiment have opposite polarities, respectively.

In the present specification, it is meant that the electrons or holes are majority carriers in the layers or regions specified with N or P, respectively. Also, '+' and '−' attached on 'N' and 'P' respectively mean that the higher doping concentration and the lower doping concentration than the layer or region to which it is not attached.

Figure 1A:
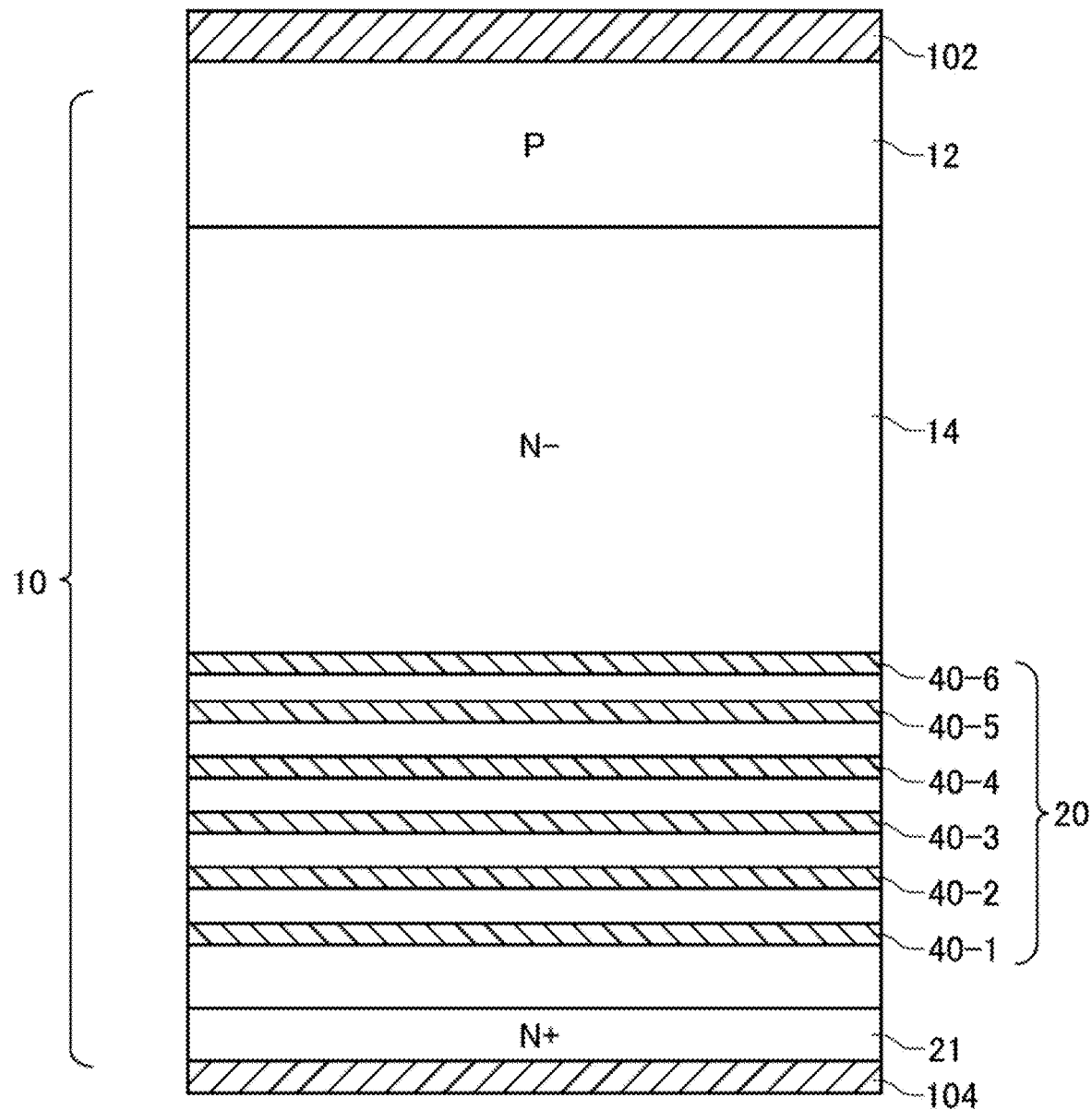
FIG. 1A is a cross-sectional view briefly showing a semiconductor device 100 according to an embodiment.

FIG. 1A is a cross-sectional view briefly showing a semiconductor device 100 according to an embodiment. The semiconductor device 100 is a vertical semiconductor device in which an electrode is formed on an upper surface and a back surface of a semiconductor substrate 10 and current flows in the thickness direction of the semiconductor substrate 10. In the present example, a freewheeling diode (FWD) is illustrated as one example of the semiconductor device 100. The semiconductor device 100 includes the semiconductor substrate 10, an upper-surface-side electrode 102 and a back-surface-side electrode 104.

The upper-surface-side electrode 102 is provided closer to the upper surface of the semiconductor substrate 10. The upper-surface-side electrode 102 of the present example has a planar shape. However, the upper-surface-side electrode 102 of another example may have a trench shape. If the semiconductor device 100 is the FWD, the upper-surface-side electrode 102 is an anode electrode.

The back-surface-side electrode 104 is provided at the back surface side of the semiconductor substrate 10. If the semiconductor device is the FWD, the back-surface-side electrode 104 is a cathode electrode.

The semiconductor substrate 10 is formed of semiconductor material such as silicon or a chemical compound semiconductor. The semiconductor substrate 10 is doped with impurities of a given concentration. The semiconductor substrate 10 has a first conductivity type. For example, the semiconductor substrate 10 is N−-type. In the present example, the first conductivity type is described as N-type while the second conductivity type as P-type. However, the first conductivity type may be P-type while the second conductivity type may be N-type. The semiconductor substrate 10 has an upper-surface-side region 12, a drift region 14, a buffer region 20, and a cathode region 21. The buffer region 20 may function as a field stop layer that suppresses extension of the depletion layer.

The drift region 14 has the first conductivity type. That is, the drift region 14 of the present example has the same conductivity type as the semiconductor substrate 10. The drift region 14 of the present example is of N−-type.

The upper-surface-side region 12 is arranged at the upper surface side of the semiconductor substrate 10 and is doped with impurities of a conductivity type different from that of the drift region 14. In the present example, the upper-surface-side region 12 is P-type. If the semiconductor device 100 is the FWD, the upper-surface-side region 12 functions as an anode region.

The cathode region 21 is provided at the back surface side of the semiconductor substrate 10. The cathode region 21 has the first conductivity type. The cathode region 21 of the present example is of N+-type. The cathode region 21 is one example of a back-surface-side region arranged between the buffer region 20 and the back-surface-side electrode 104.

The buffer region 20 is arranged at the back surface side of the semiconductor substrate 10. The buffer region 20 has the same conductivity type as that of the drift region 14 and is doped with impurities at a higher concentration than the drift region 14. In the present example, the buffer region 20 is N+-type. The buffer region 20 has a plurality of peaks 40. The buffer region 20 of the present example has six peaks 40-1, 40-2, 40-3, 40-4, 40-5, and 40-6 of the doping concentration. However, the number of the peaks 40 that the buffer region 20 has is not limited to this. The plurality of peaks 40 may be formed by implanting impurities from the back surface side of the semiconductor substrate 10 with different acceleration energies. Also, by implanting protons with changing the implantation amount per unit area, the doping concentration can be adjusted according to the position of the protons. Here, the doping concentration means a doping concentration of dopants electrically activated as of N-type or P-type.

Also, the buffer region 20 suppresses the depletion layer which extends from an interface of the upper-surface-side region 12 and the drift region 14, from reaching the back-surface-side region of the semiconductor substrate 10. The buffer region 20 is formed by implanting protons from the back surface side of the semiconductor substrate 10 and performing thermal treatment. The peaks 40 are formed by implanting small-mass impurities such as hydrogen ions such as protons, from the back surface side of the semiconductor substrate 10. By using lightweight impurities such as protons, the positions of the peaks 40 can be controlled with a high accuracy. The impurities are preferably substance having a smaller mass than phosphorus and selenium. For example, in a region into which protons are implanted, a high-concentration N+ layer is formed by hydrogen-induced donors in which the complex defects due to the implanted hydrogens and vacancies and the like of the semiconductor substrate 10 become donors.

Figure 1B:
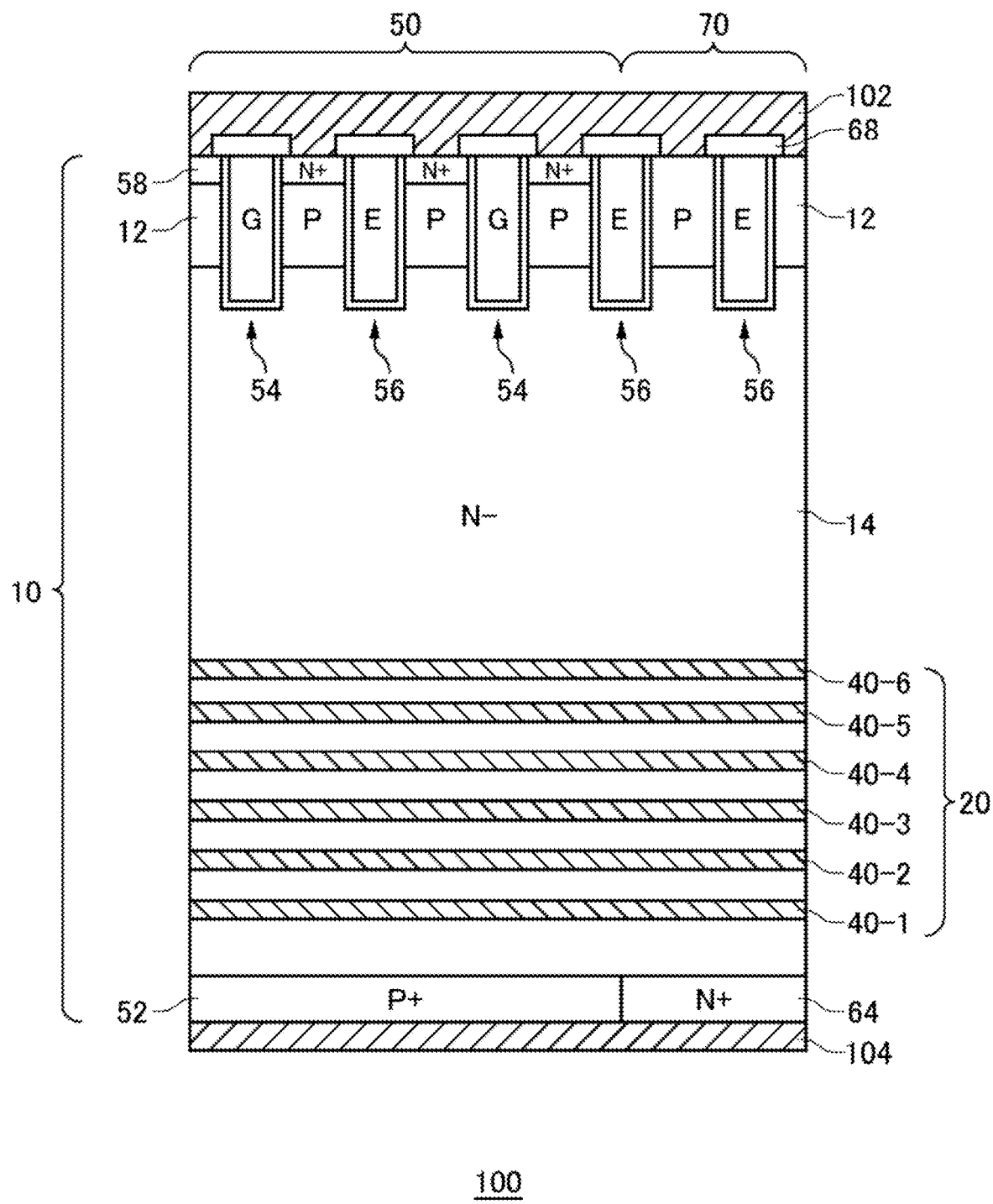
FIG. 1B is a cross-sectional view briefly showing a semiconductor device 100 according to an embodiment.

FIG. 1B is a cross-sectional view briefly showing a semiconductor device 100 according to an embodiment. The semiconductor device 100 of the present example has a transistor section 50 and a diode section 70.

The transistor section 50 and the diode section 70 are provided being adjacent to each other. The transistor section 50 of the present example has an insulated gate bipolar transistor (IGBT: Insulated Gate Bipolar Transistor). The same configuration as the configuration illustrated in FIG. 1A is illustrated with the same reference numeral, unless otherwise specified. Note that, if the semiconductor device 100 is the IGBT, the upper-surface-side electrode 102 is an emitter electrode, and the back-surface-side electrode 104 is a collector electrode.

Note that, in the present example, an example of a Reverse-conducting IGBT including a diode section 70 is described, but the semiconductor device may be an IGBT not including a diode section 70. The embodiment described below has the similar effect even with the IGBT not including a diode section 70.

The semiconductor substrate 10 of the present example has a P-type upper-surface-side region 12 which functions as a base region, an N−-type drift region 14, a buffer region 20, a collector region 52, and a cathode region 64. The semiconductor substrate 10 of the present example has a gate trench 54, an emitter trench 56, and an N+-type emitter region 58 at the upper surface side. In the longitudinal direction of the gate trench 54 or the emitter trench 56, the emitter region 58 and the P+-type contact region (which is not shown) are alternately provided. The contact region has a higher doping concentration than that of the upper-surface-side region 12.

In the transistor section 50, a plurality of gate trenches 54 and a plurality of emitter trenches 56 that reach the drift region 14 from the upper surface of the semiconductor substrate 10 are provided. Inside the gate trench 54, a gate electrode G is arranged to which a gate voltage is applied. Inside the emitter trench 56, an emitter electrode E is arranged which is electrically connected to an upper-surface-side electrode 102 which functions as an emitter electrode. A P+-type collector region 52 is provided at the back surface side corresponding to the transistor section 50.

The collector region 52 is a back-surface-side region between the buffer region 20 and the back-surface-side electrode 104. The collector region 52 has a conductivity type different from that of the semiconductor substrate 10. The collector region 52 of the present example has a conductivity type of a P+-type.

The insulating film 68 is arranged on the semiconductor substrate 10. The insulating film 68 of the present example is arranged between the gate electrode G and the emitter electrode E, and the upper-surface-side electrode 102. Also, in a part of regions in the insulating film 68, a through hole is formed to connect the emitter electrode E and the upper-surface-side electrode 102.

In the diode section 70, a P-type upper-surface-side region 12 which functions as a base region, an N−-type drift region 14, a buffer region 20, and an N+-type cathode region 64 are provided from the upper surface side of the semiconductor substrate 10. In the diode section 70, a plurality of emitter trenches 56 that reach the drift region 14 from the upper surface of the semiconductor substrate 10 are provided. Note that, the back-surface-side electrode 104 is in contact with the collector region 52 and the cathode region 64 at the back surface of the semiconductor substrate 10.

Figure 2:
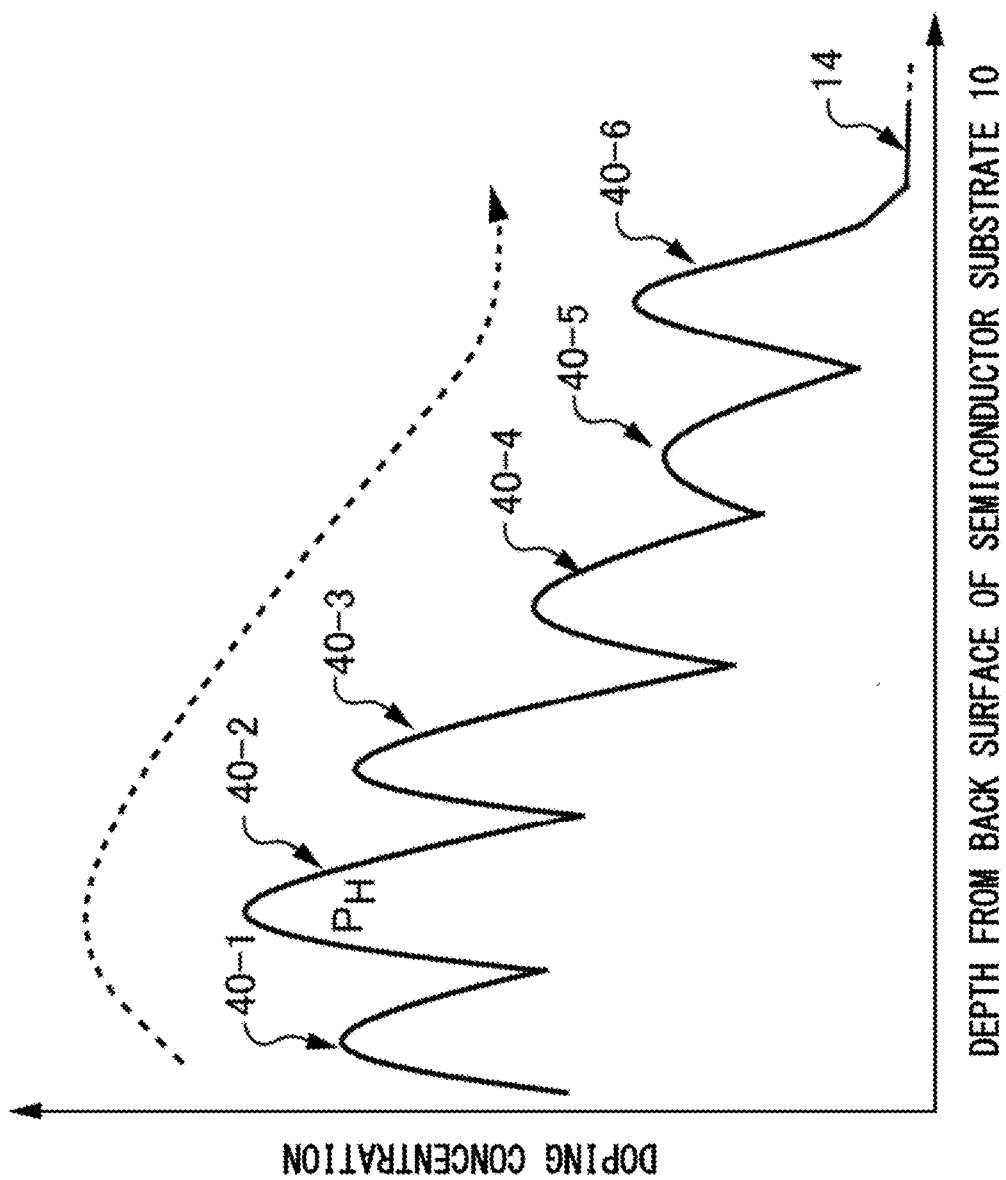
FIG. 2 shows one example of a doping concentration distribution of a semiconductor substrate 10 according to an embodiment.

FIG. 2 shows one example of a doping concentration distribution of the buffer region 20, among doping concentration distributions of a semiconductor substrate 10 according to FIG. 1A or FIG. 1B of an embodiment. The horizontal axis indicates the depth from the back surface of the semiconductor substrate 10, and the vertical axis indicates the doping concentration. Here, illustration of the cathode region 64 which is the back surface outermost layer is omitted.

The doping concentration distribution of the present example includes six peaks at which the doping concentration reaches the local maximum, that is, the doping concentration locally turns from an increase to a decrease (peaks 40-1-40-6). Six peaks 40-1-40-6 are provided in this order from the back surface side of the semiconductor substrate 10. The peak 40-1 is one example of the first peak. The peak 40-2 is one example of the second peak.

The peak 40-1 has a predetermined doping concentration, and is provided the closest to a back surface of the semiconductor substrate 10 among the plurality of peaks 40. The peak 40-1 of the present example has a lower concentration than that of the peak 40-2.

The peak 40-2 has a higher doping concentration than the doping concentration of the peak 40-1. The peak 40-2 is provided closer to the upper surface of the semiconductor substrate 10 than the peak 40-1 is. The peak 40-2 is one example of the high-concentration peak $P_H$. The peak 40-2 may be the highest concentration peak among the plurality of peaks 40.

The high-concentration peak $P_H$ refers to the highest concentration peak among the plurality of peaks 40. The high-concentration peak $P_H$ is provided closer to the upper surface of the semiconductor substrate 10 than the peak 40-1 is, among the plurality of peaks 40. The high-concentration peak $P_H$ of the present example is provided the second closest next to the peak 40-1 from the back surface side of the semiconductor substrate 10 among the plurality of peaks 40. That is, in the present example, the second peak is the high-concentration peak $P_H$.

The peak 40-3 to the peak 40-6 are provided closer to the upper surface than the peak 40-2 is. The peak 40-3 to the peak 40-6 have lower doping concentrations than the doping concentration of the high-concentration peak $P_H$. The peak 40-3 and the peak 40-4 are provided closer to the upper surface of the semiconductor substrate 10 than the high-concentration peak $P_H$ is. The peak 40-3 to the peak 40-6 are one example of the low-concentration peak.

That is, in the semiconductor substrate 10 of the present example, the doping concentration of the peak 40-2 is higher than the doping concentration of the peak 40-1 and the doping concentrations of the peak 40-3 to the peak 40-6. Accordingly, the semiconductor substrate 10 has an upwardly-convex doping concentration distribution. In the present example, the case where the doping concentration of the peak 40-2 is the high-concentration peak $P_H$ has been described. However, as long as the semiconductor substrate 10 has an upwardly-convex doping concentration distribution, the peak 40 which is provided closer to the upper surface than the peak 40-2 is may be the high-concentration peak $P_H$. Note that, in the present example, the doping concentration of the peak 40-6 is higher than the doping concentration of the peak 40-5.

In the present example, the peak 40-1 has the second highest concentration next to the peak 40-2, which is the high-concentration peak $P_H$. That is, the peak 40-1 has a higher doping concentration than those of the peak 40-3 to the peak 40-6. This enables the peak 40-1 to surely stop the extension of the depletion layer from the upper surface side of the semiconductor substrate 10. This enhances the breakdown voltage of the semiconductor device 100.

Here, from the perspective of the manufacturing process, the semiconductor substrate 10 may preferably have a doping concentration distribution in which the plurality of peaks 40 are arranged in and upwardly-convex manner. For example, in the step of forming the peaks 40, when implanting ions into a region at a shallow position at the back surface side of the semiconductor substrate 10, the acceleration energy at the time of implanting is lowered when compared with the case when implanting ions into a region at a deep position. If the acceleration energy at the time of implanting is low, the amount of ions that can be implanted for a certain time period is small. For this reason, the processing time of the step of forming the high-concentration peak 40 in a region at a shallow position at the back surface side of the semiconductor substrate 10 is prolonged, and the manufacturing efficiency of the semiconductor device 100 deteriorates in some cases. In the semiconductor device 100 of the present example, because the shallowest peak 40-1 has a lower concentration than that of the peak 40-2, the processing time for forming the peaks 40 can be shortened. Accordingly, this improves the manufacturing efficiency of the semiconductor device 100.

Also, also from the perspective of optimization of device characteristics, the semiconductor substrate 10 may preferably have a doping concentration distribution in which the plurality of peaks 40 are arranged in and upwardly-convex manner. For example, if a high-concentration peak 40 is formed at a region close to the back surface of the semiconductor substrate 10, this may affect the amount of holes implanted from the back surface of the semiconductor substrate 10. Because the semiconductor device 100 of the present example suppresses the doping concentration of the peak 40-1 close to the back surface of the semiconductor substrate 10, the influences on the device characteristics by the variations occur in the process steps are small. On the other hand, by making a doping concentration of a region at a deep position from the back surface of the semiconductor substrate 10 higher, the function as a field stop layer for suppressing the depletion layer which extends from the upper surface side of the semiconductor substrate 10 can be maintained. Thereby, the semiconductor device 100 can suppress the leakage current.

The acceleration energy at which hydrogen ions irradiate the semiconductor substrate 10 may have such a value that the hydrogen ions do not pass (or penetrate) through the semiconductor substrate 10. Conventionally, an energy absorbent member is installed between an accelerator for hydrogen ions and a semiconductor substrate, and irradiation is performed at high acceleration energy (for example, 10 MeV or more) such that hydrogen ions irradiating the semiconductor substrate penetrates the semiconductor substrate. In this case, the position at which the hydrogen ions stop inside the semiconductor substrate (that is, the depth of the hydrogen ions is adjusted by adjusting the thickness or the like of the energy absorbent member, which is configured to absorb the energy of the hydrogen ions. In the hydrogen ion irradiation at such high acceleration energy, damage to the semiconductor substrate is too large, and a full width at half maximum of the hydrogen ions is several dozen μm or more, so that a distribution width of lattice defects with respect to a thickness of the semiconductor substrate is also increased. In contrast, if hydrogen ions irradiate the semiconductor substrate at such acceleration energy that hydrogen ions stop inside the semiconductor substrate without using an energy absorbent member, hydrogen induced donors can be formed without giving excessive damages (that is, disorder).

When the energy absorbent member is not used and hydrogen ions irradiate the semiconductor substrate, the acceleration energy may be set as follows. If the semiconductor substrate is silicon, the relationship of the following equation (1) may be satisfied.

$$y=-0.0047x^4+0.0528x^3-0.2211x^2+0.9923x+5.0474 \quad (1)$$

Here, Rp denotes the range of hydrogen ions in the semiconductor substrate (that is, the position at which the concentration of hydrogen ions peaks), E denotes the acceleration energy of hydrogen ions, x denotes the log (Rp), which is the logarithmic of the range Rp of hydrogen ions, y denotes the log (E), which is the logarithmic of the acceleration energy E of hydrogen ions.

Note that, the acceleration energy E of hydrogen ion irradiation may be calculated (calculated value E) from the average range Rp of desired hydrogen ions using the above curve fitting equation. When hydrogen ions are implanted into the silicon substrate with the calculated value E of the acceleration energy, the relationship between the actual acceleration energy E' and the average range Rp' (hydrogen ions peak position) actually obtained by Secondary Ion Mass Spectrometry (SIMS) and the like may be considered as follows. When the actual acceleration energy E' is within a range of about ±10% of the calculated value E, the calculated value E of the acceleration energy, the actual average range Rp' also falls within a range of about ±10% of the desired average range Rp to be within tolerance. For this reason, influences of variations of the actual average range Rp' from the desired average range Rp on electrical characteristics of IGBTs, diodes and the like are sufficiently small to a negligible extent. Therefore, if the actual acceleration energy E' is within the range of ±5% of the calculated value E, the actual average range Rp' can be determined to be substantially equal to the average range Rp as set. Alternatively, there is no problem if the actual average range Rp' falls within ±10% of the average range Rp that is assigned into the above equation (1) in order to obtain the actual acceleration energy E'.

In the actual accelerator, because both the acceleration energy E and the average range Rp can fall within the above range (±10%), the following consideration is completely no problem: the actual acceleration energy E' and the actual average range Rp' conform with the above-mentioned curve fitting equation that is expressed by a desired average range Rp and the calculated value E. Furthermore, the range of the variation or error may be smaller than or equal to the above-mentioned ±10% with respect to the average range Rp, and preferably may fall within ±5% thereof. If the above mentioned condition is satisfied, it can be considered that Rp' conforms satisfactorily to the above equation (1). By using the above equation (1), the acceleration energy E of hydrogen ions required to obtain the desired range Rp of hydrogen ions can be calculated.

Also, if the energy absorbent member is not used and hydrogen ions are implanted with such an acceleration energy to such an extent that hydrogen ions remain in the semiconductor substrate, the full width at half maximum ΔRp of hydrogen in the implantation direction may satisfy the following equation (2).

$$y=-0.00135x^6+0.01761x^5-0.07529x^4+0.08228x^3+ \\ 0.21880x^2+0.41061x-0.98152 \quad (2)$$

Here, x denotes the log (Rp) which is the logarithmic of the range Rp of hydrogen ions, and y denotes the log ΔRp which is the logarithmic of the full width at half maximum (ΔRp).

Furthermore, when about 300° C. to 450° C. thermal treatment is performed after implanting hydrogen ions, the implanted hydrogens are diffused inside the semiconductor substrate. For this reason, each peak 40 of the buffer region 20 may have a doping concentration distribution with a full width at half maximum with ΔRp', the value which is 5 to 20 times (preferably 7 to 10 times) as large as a full width at half maximum ΔRp satisfying the equation (2). That is, if the doping concentration of the buffer region 20 measured by the Spread Resistance Profiling, the capacitance-voltage method (C-V method) or the like satisfies ΔRp', the implanted hydrogen ions can be considered to have been implanted at such an acceleration energy that ions irradiating the semiconductor substrate do not pass (or penetrate) through the semiconductor substrate 10.

Alternatively, more simply, if the full width at half maximum ΔD about the doping concentration of each peak 40 is smaller than or equal to 20%, preferably smaller than or equal to 10% of the depth D from the back surface of each peak 40, the implanted hydrogen ions may be considered to have been implanted at an acceleration energy of a value such that hydrogen ions irradiating do not pass (or penetrate) the semiconductor substrate 10.

As mentioned above, the semiconductor device 100 of the present example has the high-concentration peak $P_H$ closer to the upper surface of the semiconductor substrate 10 than the peak 40-1, the high-concentration peak $P_H$ having a higher concentration than the peak 40-1, which is the closest to the back surface of the semiconductor substrate 10. This enables the semiconductor device 100 to improve the manufacturing efficiency and to optimize the device characteristics. For example, the semiconductor device 100 of the present example can optimize the ON voltage Von and the tail current while the semiconductor device is turned off and the like.

Figure 3:
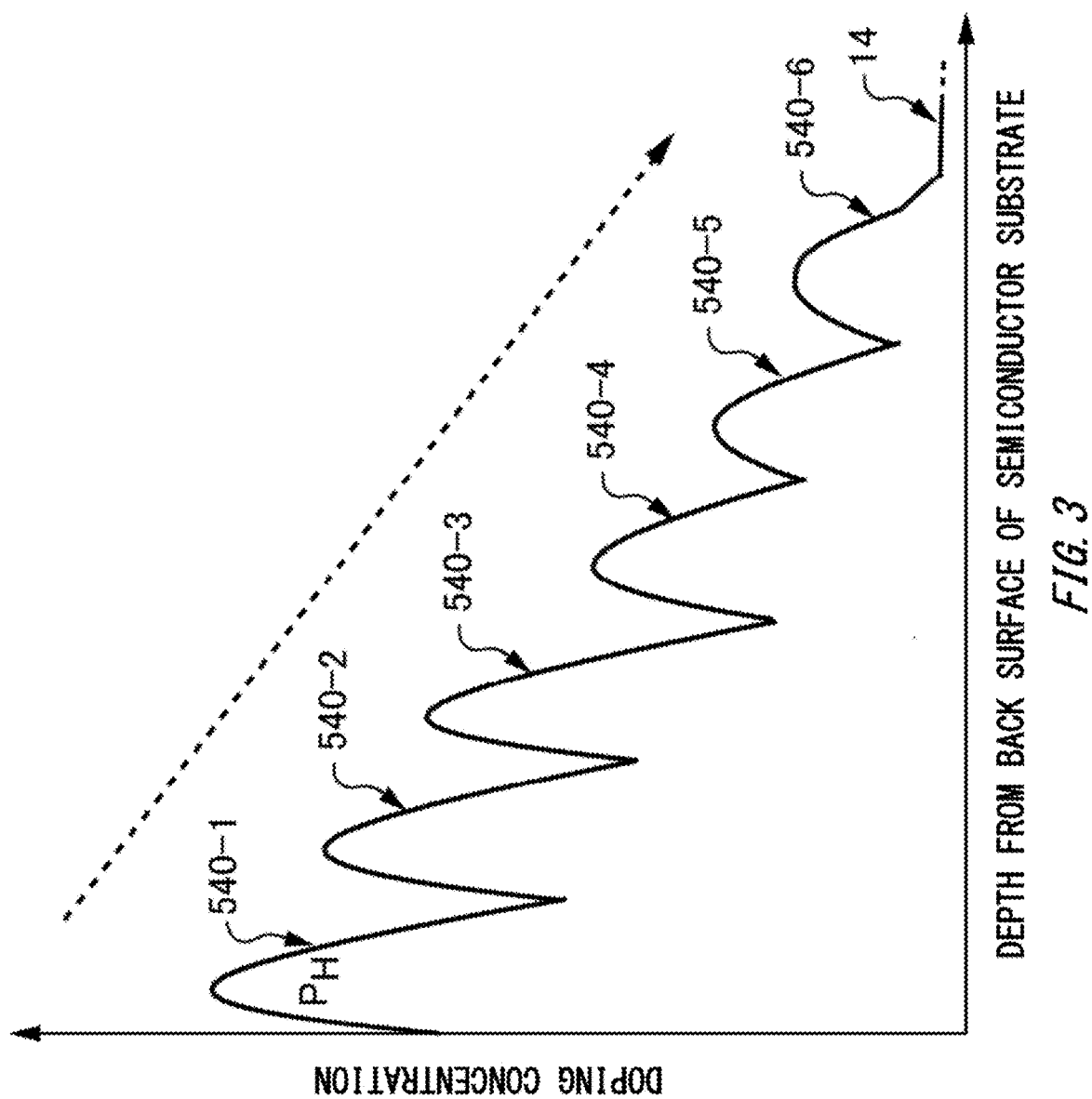
FIG. 3 shows one example of a doping concentration distribution of a semiconductor substrate according to the comparative example 1.

FIG. 3 shows one example of a doping concentration distribution of a semiconductor substrate according to the comparative example 1. The horizontal axis indicates the depth from the back surface of the semiconductor substrate, and the vertical axis indicates the doping concentration.

The doping concentration distribution of the present example includes six peaks 540-1-540-6. Six peaks 540-1-540-6 are provided in this order from the back surface side of the semiconductor substrate 10. The semiconductor device of the present example has a doping concentration distribution in which the peaks 540 sequentially fall from the back surface side of the semiconductor substrate. The peak 540-1 has a higher doping concentration than the doping concentration of the peak 540-2. Then, the peak 540-1 is the high-concentration peak $P_H$.

Here, when ion-implanting protons into a part at a shallow position through the back surface of the semiconductor substrate, it is necessary to suppress the acceleration energy to a low level. In this case, because the amount of ions that can be ion-implanted for a certain time period decreases, the manufacturing efficiency may worsen with the doping concentration distribution in which a doping concentration of a part at a shallow position through the back surface side of the semiconductor substrate is high.

Also, the amount of holes implanted from the back surface of the semiconductor substrate is set in order to optimize the characteristics of the semiconductor device. Furthermore, the protons at a shallow position close to the back surface boron at the back surface of the semiconductor substrate may greatly affect the amount of holes implanted from the back surface. For this reason, it is necessary to appropriately control the dosage of protons. If the proton dosage closest to the back surface is reduced in order to optimize the characteristics of the semiconductor device, in the doping concentration distribution in which the peak concentrations sequentially fall, the total dosage of the entire proton layer becomes small. Because of this, peaks 40 may not serve as the buffer region for stopping the depletion layer. Also, if the total dosage of protons is small, dangling bonds of silicon atoms in a crystal defect portion generated by ion implantation cannot be terminally bonded with hydrogen, and the leakage current may increase.

Figure 4A:
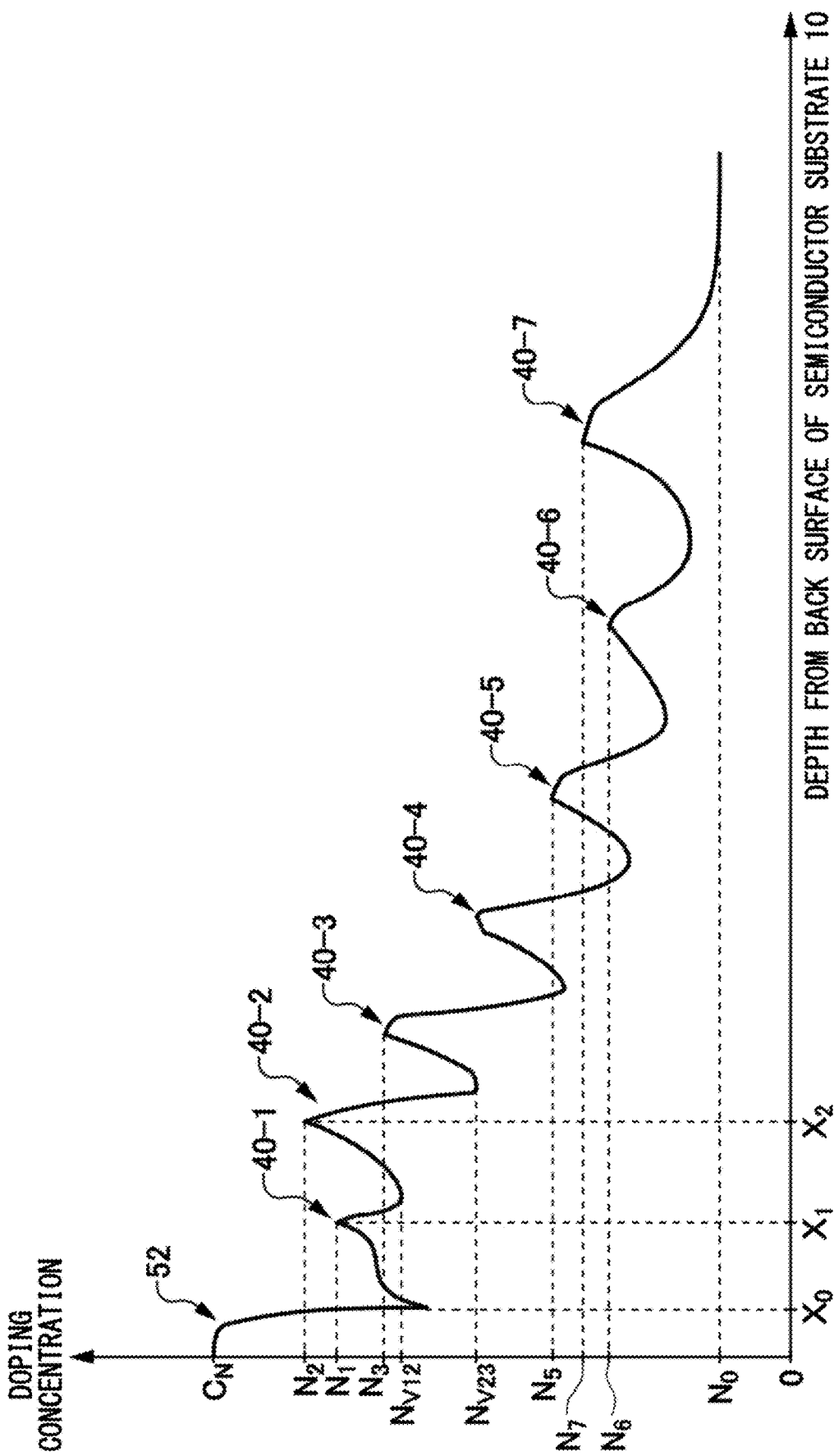
FIG. 4A shows one example of a more detailed doping concentration distribution of a semiconductor substrate 10 according to an embodiment.

FIG. 4A shows one example of a more detailed doping concentration distribution of a semiconductor substrate 10 according to an embodiment. The doping concentration distribution of the present example shows the doping concentration distribution in the depth direction of the semiconductor substrate 10 in the transistor section 50. For this reason, a doping concentration $C_N$ of the collector region 52 is shown at the back surface side of the semiconductor substrate 10.

The doping concentration distribution of the present example includes seven peaks 40-1-40-7. The seven peaks 40-1-40-7 are provided in this order from the back surface side of the semiconductor substrate 10. The substrate concentration $N_0$ refers to the doping concentration of the semiconductor substrate 10. The doping concentration $N_2$ of the peak 40-2 is higher than the doping concentration $N_1$ of the peak 40-1. Also, the peak 40-3 to the peak 40-6 have a doping concentration distribution in which doping concentrations of the peak 40-3 to the peak 40-6 sequentially fall from the back surface side toward the upper surface side of the semiconductor substrate 10. However, the doping concentration $N_7$ of the peak 40-7 of the present example is higher than the doping concentration $N_6$ of the peak 40-6.

The peak 40-1 is provided at the depth $X_1$ from the back surface of the semiconductor substrate 10. The peak 40-2 is provided at the depth $X_2$ from the back surface of the semiconductor substrate 10. That is, $X_1<X_2$ holds. The depths of the plurality of peaks 40 may be appropriately changed according to the structure of the semiconductor device 100 and the like. In one example, the depth $X_2$ of the peak 40-2 is between 1 μm and 12 μm inclusive. Also, the depth $X_2$ of the peak 40-2 may be between 2 μm and 5 μm inclusive.

The distance $X_2-X_1$ in the depth direction between the peak 40-2 and the peak 40-1 may be smaller than the depth $X_1$ from the back surface of the semiconductor substrate 10, of the peak 40-1. In this case, $X_2-X_1<X_1$ holds. This makes it difficult to change the speed at which the depletion layer extends, and can suppress the vibration.

Also, the depth $X_0$ from the back surface of the semiconductor substrate 10, of the boundary position between the peak 40-1 and the collector region 52, may be smaller than the distance $X_1-X_0$ in the depth direction between the peak 40-1, and the boundary position between the peak 40-1 and the collector region 52. In this case, $X_0<X_1-X_0$ holds. This can reduce variations in the ON voltage Von.

The semiconductor substrate 10 has a doping concentration $N_V$ of a valley of a doping concentration distribution between the peaks of the plurality of peaks 40. In the present specification, the valley of the doping concentration distribution refers to the part where the doping concentration distribution shows the local minimum value. The semiconductor substrate 10 of the present example has a plurality of valleys. For example, the doping concentration $N_{V12}$ refers to the doping concentration of the doping concentration valley between the peak 40-1 and the peak 40-2. Also, the doping concentration $N_{V23}$ refers to the doping concentration of the doping concentration valley between the peak 40-2 and the peak 40-3. The doping concentration $N_{V12}$ of the present example is larger than the substrate concentration $N_0$ of the semiconductor substrate 10. In one example, the doping concentration $N_{V12}$ is 10 times or more as high as a substrate concentration $N_0$ of the semiconductor substrate 10. This suppresses the spreading of the depletion layer. Also, the doping concentration $N_{V12}$ may be lower than the doping concentration $N_3$ of the peak 40-3.

The concentration ratio $N_2/N_1$ refers to the concentration ratio of the doping concentration of the peak 40-2 to the doping concentration of the peak 40-1. In one example, the concentration ratio $N_2/N_1$ is $1<N_2/N_1 \leq 100$. Also, the upper limit of the concentration ratio $N_2/N_1$ may be smaller than or equal to 10, or may be smaller than or equal to 5. For example, if the lower limit of the concentration ratio $N_2/N_1$ is too low, defects may remain too much. On the other hand, if the concentration ratio $N_2/N_1$ is too high, the ON voltage Von may fluctuate in relation to the impurities forming the collector region 52 when the concentration deviates.

The doping concentrations $N_V$ of the plurality of valleys sequentially fall from the back surface side toward the upper surface side of the semiconductor substrate 10. That is, for the doping concentrations $N_{V12}-N_{V67}$ of the six valleys between each of the seven peaks 40-1-40-7, $N_{V12}>N_{V23}$, $N_{V23}>N_{V34}$, $N_{V34}>N_{V45}$, $N_{V45}>N_{V56}$, and $N_{V56}>N_{V67}$ are satisfied. Note that, in FIG. 4A, in order to simplify the drawing, $N_{V34}$, $N_{V45}$, $N_{V56}$, and $N_{V67}$ are omitted.

Here, $N_1/N_{V12}$ may be smaller than $N_2/N_1$. Thereby, when the depletion layer exceeds $X_2$, the depletion layer can be suppressed between $X_1$ and $X_2$. Also, $N_1/N_{V12}$ may be larger than or equal to $N_2/N_1$. Or, $N_1/N_{V12}$ may be higher than $N_2/N_1$. This can facilitate implanting of holes from the collector region 52 and suppress the deviation in the ON voltage Von.

Here, the integrated concentration np from the position of the end at the upper surface side of the collector region 52 on the back surface of the semiconductor substrate 10 to the peak 40-2 is higher than half of the critical integrated concentration $n_c$ of the semiconductor substrate 10. Also, the integrated concentration np may be higher than the critical integrated concentration $n_c$. For example, the critical integrated concentration $n_c$ is indicated by the following equation from the Poisson's equation.

$$n_c = \varepsilon_s \cdot E_c / q$$

Here, $\varepsilon_s$ is the permittivity of the semiconductor, q is the elementary charge, and $E_c$ is the dielectric breakdown electric field strength of the semiconductor. For example, in the case of silicon, because $E_c$ is 1.8E5-2.5E5 (V/cm), $n_c$ is 1.2E12-1.6E12 (/cm$^2$).

As mentioned above, in the semiconductor device 100 of the present example, by providing a peak 40-1 closer to the back surface of the semiconductor substrate 10 than the high-concentration peak $P_H$ is, defects on the back surface side of the semiconductor substrate 10 can be terminally bonded. On the other hand, if the peak 40-1 is not provided at the back surface side of the high-concentration peak $P_H$, regions with many defects may remain. For example, the doping concentrations of the peak 40-1 and the peak 40-2 are preferably between 1E15 cm$^{-3}$ and 1E16 cm$^{-3}$ inclusive. Note that, E means a power of 10, and for example, 1E15 cm$^{-3}$ means $1 \times 10^{15}$ cm$^{-3}$.

Figure 4B:
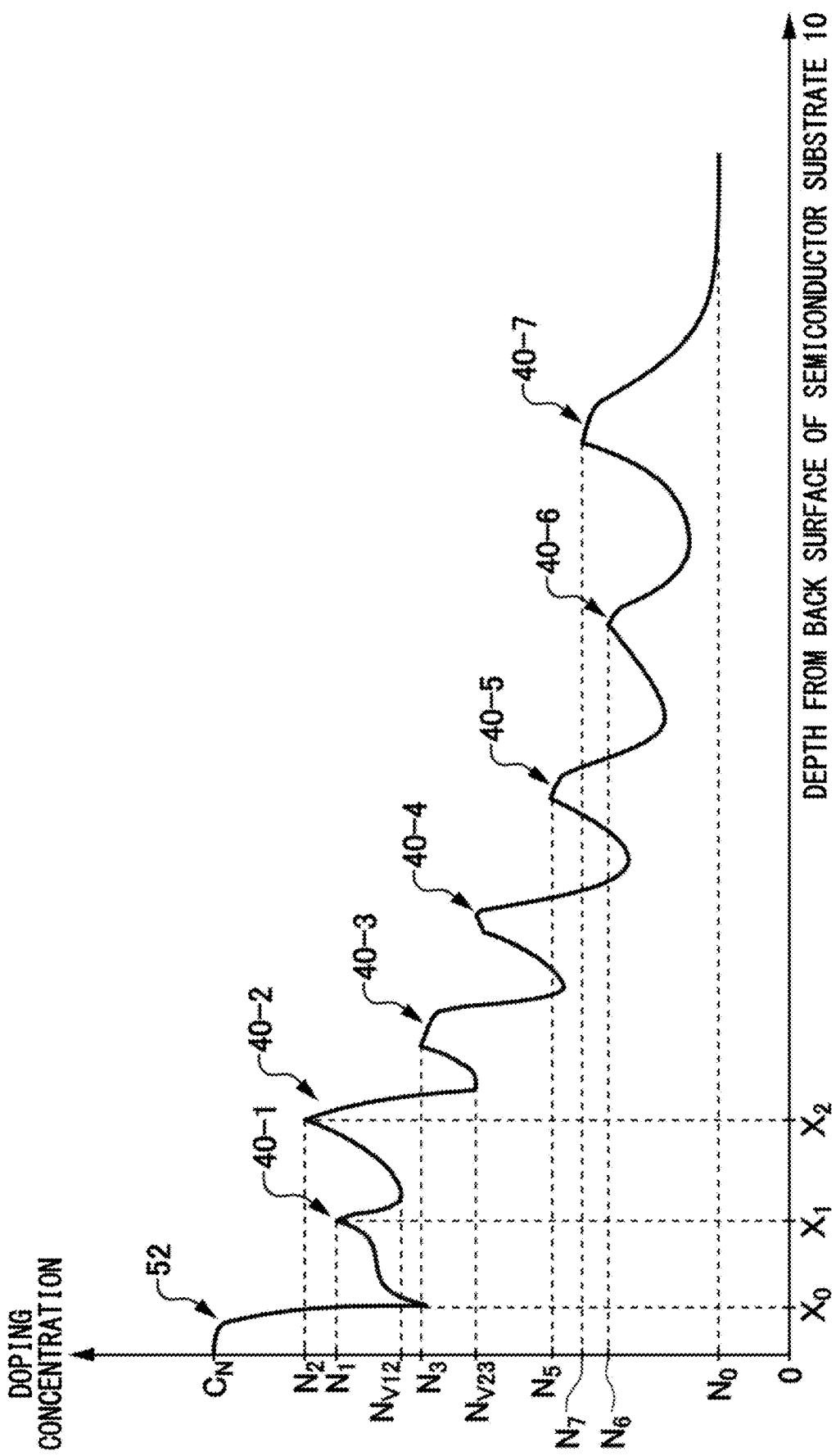
FIG. 4B shows one example of a more detailed doping concentration distribution of a semiconductor substrate 10 according to an embodiment.

FIG. 4B shows one example of a more detailed doping concentration distribution of a semiconductor substrate 10 according to an embodiment. The doping concentration distribution of the present example is different from the doping concentration distribution according to FIG. 4A in that a doping concentration $N_3$ of the peak 40-3 is lower than a doping concentration $N_{V12}$ of a doping concentration valley between the peak 40-1 and the peak 40-2. That is, $N_3<N_{V12}$ holds. Thereby, the base doping concentrations of the peak 40-1 and the peak 40-2 are high, and the depletion layer which extends from the upper surface side of the semiconductor substrate 10 can be easily stopped in the peak 40-1 and the peak 40-2.

Figure 4C:
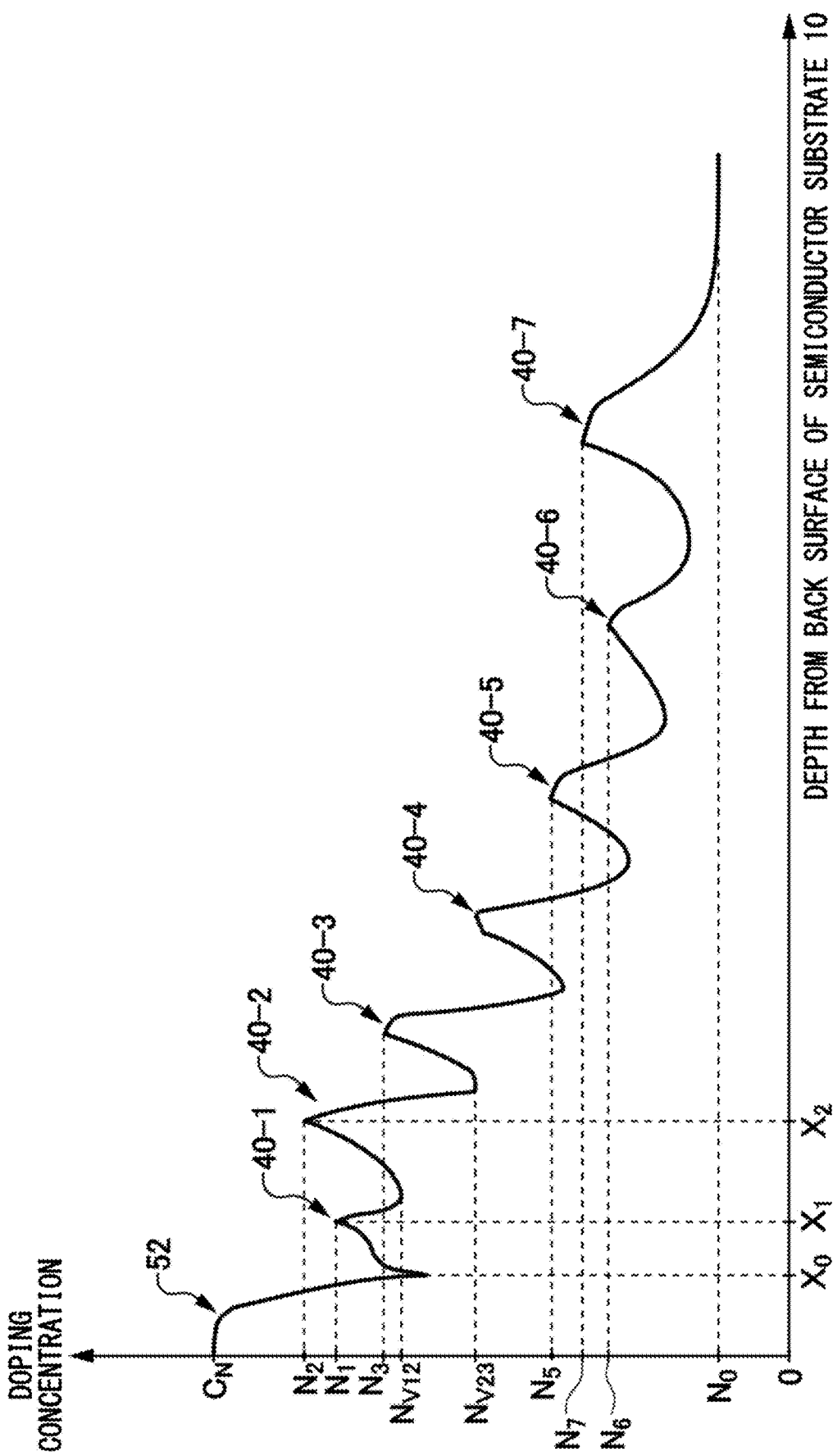
FIG. 4C shows one example of a more detailed doping concentration distribution of a semiconductor substrate 10 according to an embodiment.

FIG. 4C shows one example of a more detailed doping concentration distribution of a semiconductor substrate 10 according to an embodiment. The doping concentration distribution of the present example is different from the doping concentration distribution according to FIG. 4A in that a distance $X_0$ of a boundary position between the peak 40-1 and the collector region 52 from the back surface of the semiconductor substrate 10 is larger than a distance $X_1-X_0$ in a depth direction between the peak 40-1, and a boundary position between the peak 40-1 and the collector region 52. That is, $X_0>X_1-X_0$ holds. In this manner, by deepening the region in which the collector region 52 is formed, implantation of holes can be suppressed.

Figure 5:
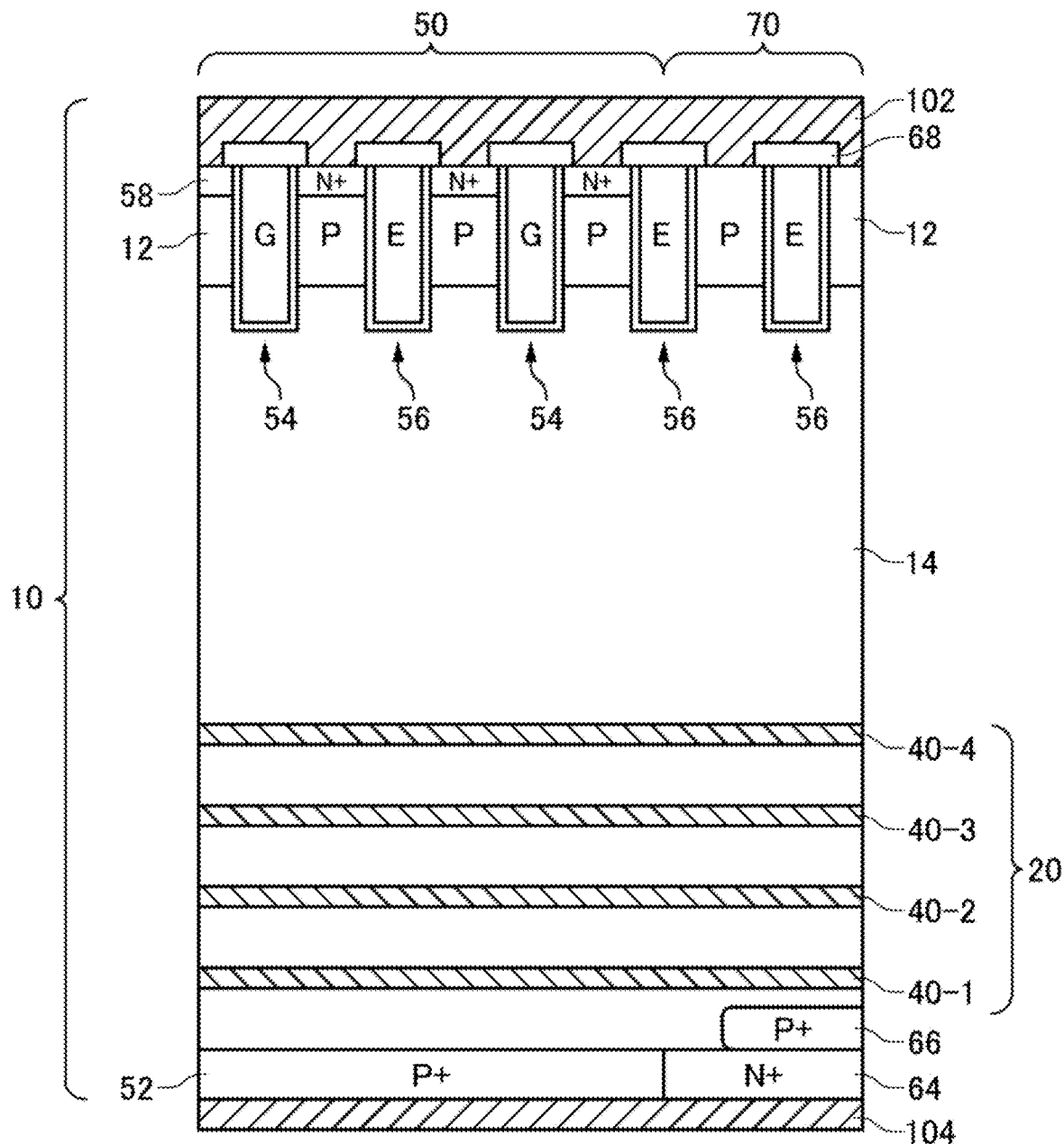
FIG. 5 shows one example of a configuration of a semiconductor device 100 having a floating layer 66.

FIG. 5 shows one example of a configuration of a semiconductor device 100 having a floating layer 66. The semiconductor device 100 of the present example is different from the semiconductor device 100 in FIG. 1B in that it has a floating layer 66 in the diode section 70.

The floating layer 66 is provided at the cathode region 64 side of the diode section 70. The floating layer 66 of the present example is provided closer to the back surface of the semiconductor substrate 10 than the peak 40-1 is. Here, the position of the floating layer 66 may be determined with a peak $F_p$ at which the doping concentration of the floating layer 66 becomes maximum as a reference. The floating layer 66 has a conductivity type different from those of the plurality of peaks 40. The conductivity type of the floating layer 66 of the present example is P+-type. The floating layer 66 is provided so as not to overlap with the plurality of peaks 40. In this manner, by shifting the floating layer 66 and the peaks of the buffer region 20, the influences on the floating layer 66 by the buffer region 20 is reduced. Thereby, even if variations occur in the doping concentration distribution due to the influences of the process, the influences on the device characteristics is reduced.

Figure 6A:
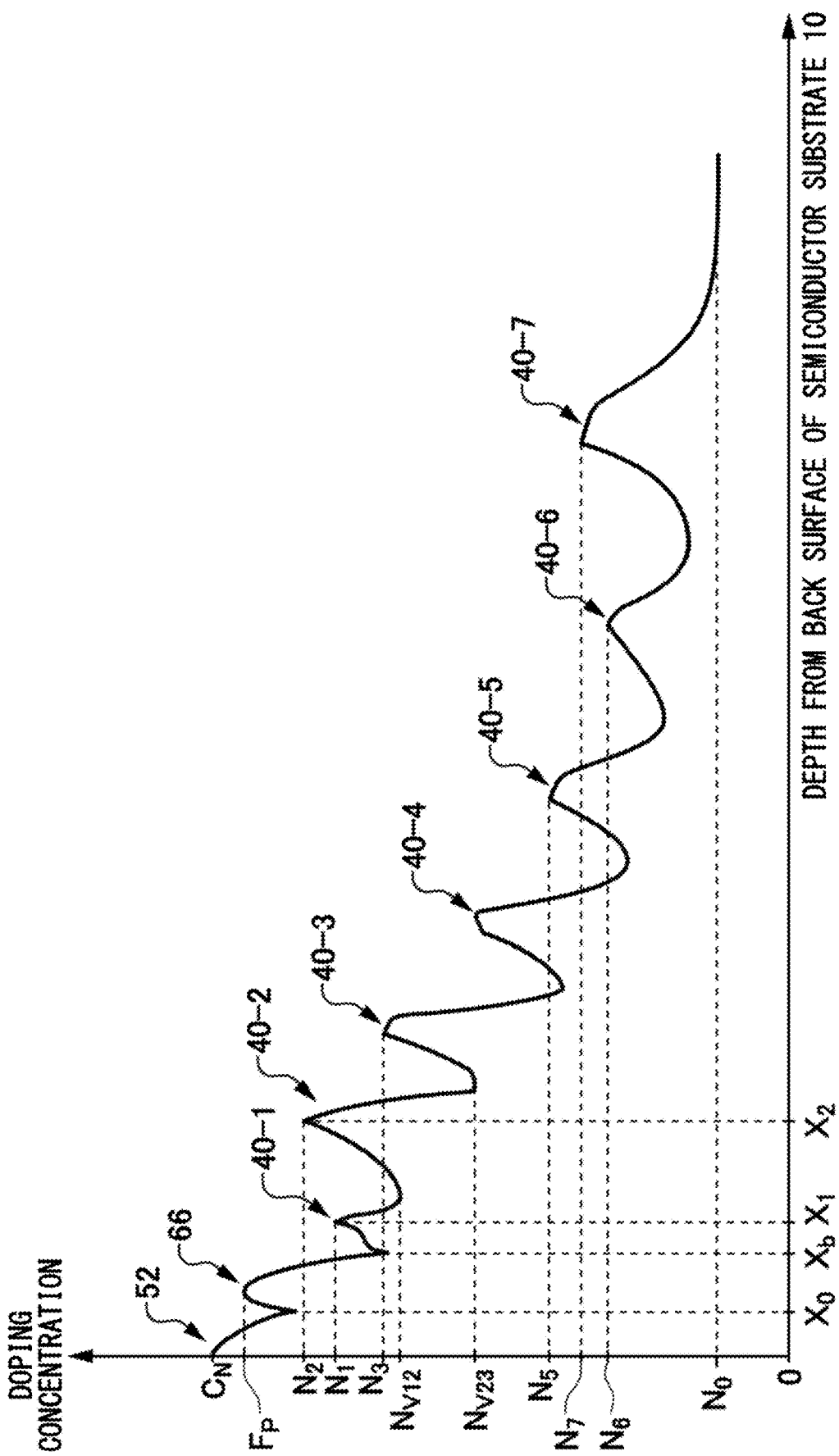
FIG. 6A shows one example of a doping concentration distribution of a semiconductor substrate 10 having a floating layer 66.

FIG. 6A shows one example of a doping concentration distribution of a semiconductor substrate 10 having a floating layer 66. The doping concentration distribution of the present example shows the doping concentration distribution in the depth direction of the semiconductor substrate 10 in the diode section 70. For this reason, the doping concentration $C_N$ of the collector region 52 and the doping concentration $F_p$ of the floating layer 66 are shown on the back surface side of the semiconductor substrate 10.

The doping concentration of the floating layer 66 is preferably higher than the doping concentration of the peak 40-1. By making the doping concentration of the floating layer 66 high, the influences on the ON voltage Von of the semiconductor device 100 by the plurality of peaks 40 can be reduced. Then, the doping concentration of the floating layer 66 may be higher than that of the high-concentration peak $P_H$. This can further reduce the influences on the device characteristics of the semiconductor device 100 by the plurality of peaks 40. Furthermore, the doping concentration of the floating layer 66 may be higher than the doping concentration of the peak 40-2.

Also, helium for lifetime control may be implanted at the back surface side of the semiconductor substrate 10. In this case, helium at the back surface side is preferably implanted avoiding the peak position of the doping concentration distribution. In one example, the back surface helium is implanted between the floating layer 66 and the peak 40-1. Also, the back surface helium may be implanted between the peak 40-1 and the peak 40-2. Furthermore, the back surface helium may be implanted closer to the upper surface side of the semiconductor substrate 10 than the high-concentration peak $P_H$. This can reduce the influences on the device characteristics of the semiconductor device 100 by implanting helium.

Figure 6B:
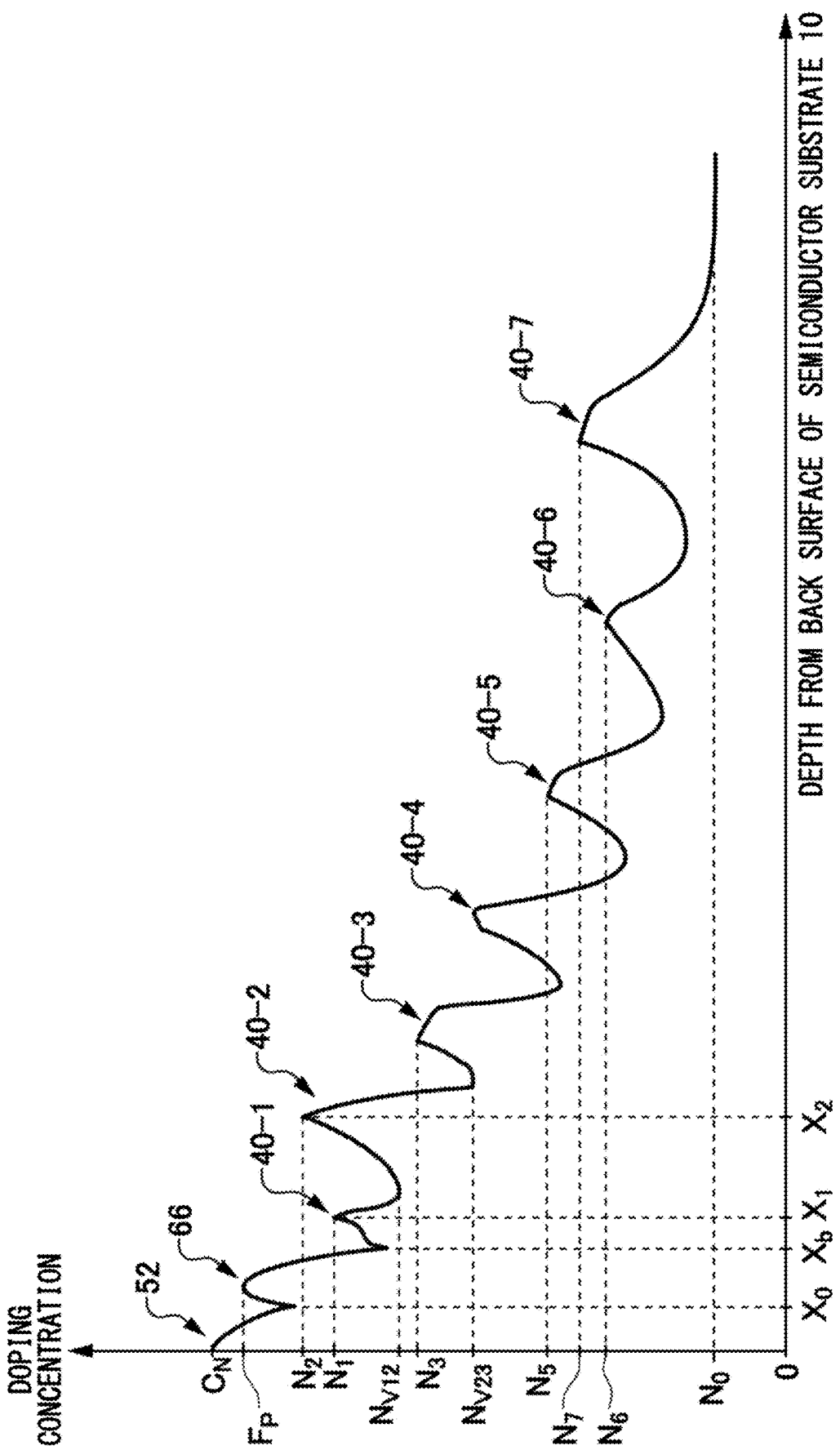
FIG. 6B shows one example of a doping concentration distribution of a semiconductor substrate 10 having a floating layer 66.

FIG. 6B shows one example of a doping concentration distribution of a semiconductor substrate 10 having a floating layer 66. The doping concentration distribution of the present example is different from the doping concentration distribution according to FIG. 6A in that a doping concentration $N_3$ of the peak 40-3 is lower than a doping concentration $N_{V12}$ of a doping concentration valley between the peak 40-1 and the peak 40-2. That is, $N_3<N_{V12}$ holds. Thereby, the base doping concentrations of the peak 40-1 and the peak 40-2 are high, and the depletion layer which extends from the upper surface side of the semiconductor substrate 10 can be easily stopped in the peak 40-1 and the peak 40-2.

Figure 6C:
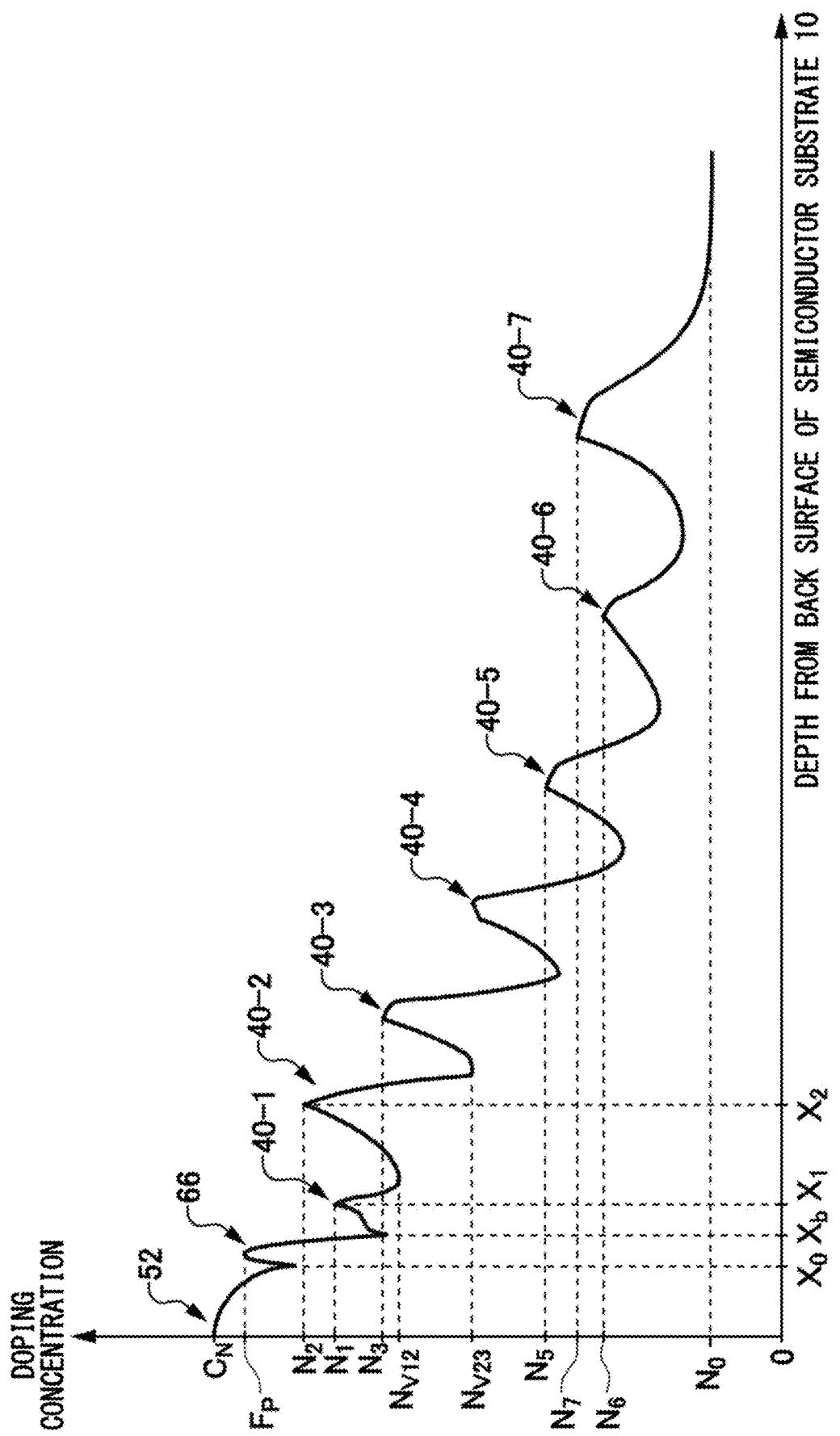
FIG. 6C shows one example of a doping concentration distribution of a semiconductor substrate 10 having a floating layer 66.

FIG. 6C shows one example of a doping concentration distribution of a semiconductor substrate 10 having a floating layer 66. The doping concentration distribution of the present example is different from the doping concentration distribution according to FIG. 6A in that a distance $X_0$ of a boundary position between the peak 40-1 and the collector region 52 from the back surface of the semiconductor substrate 10 is larger than a distance $X_1-X_0$ between the peak 40-1, and a boundary position between the peak 40-1 and the collector region 52. That is, $X_0>X_1-X_0$ holds. In this manner, by deepening the region in which the collector region 52 is formed, implantation of holes can be suppressed.

Figure 6D:
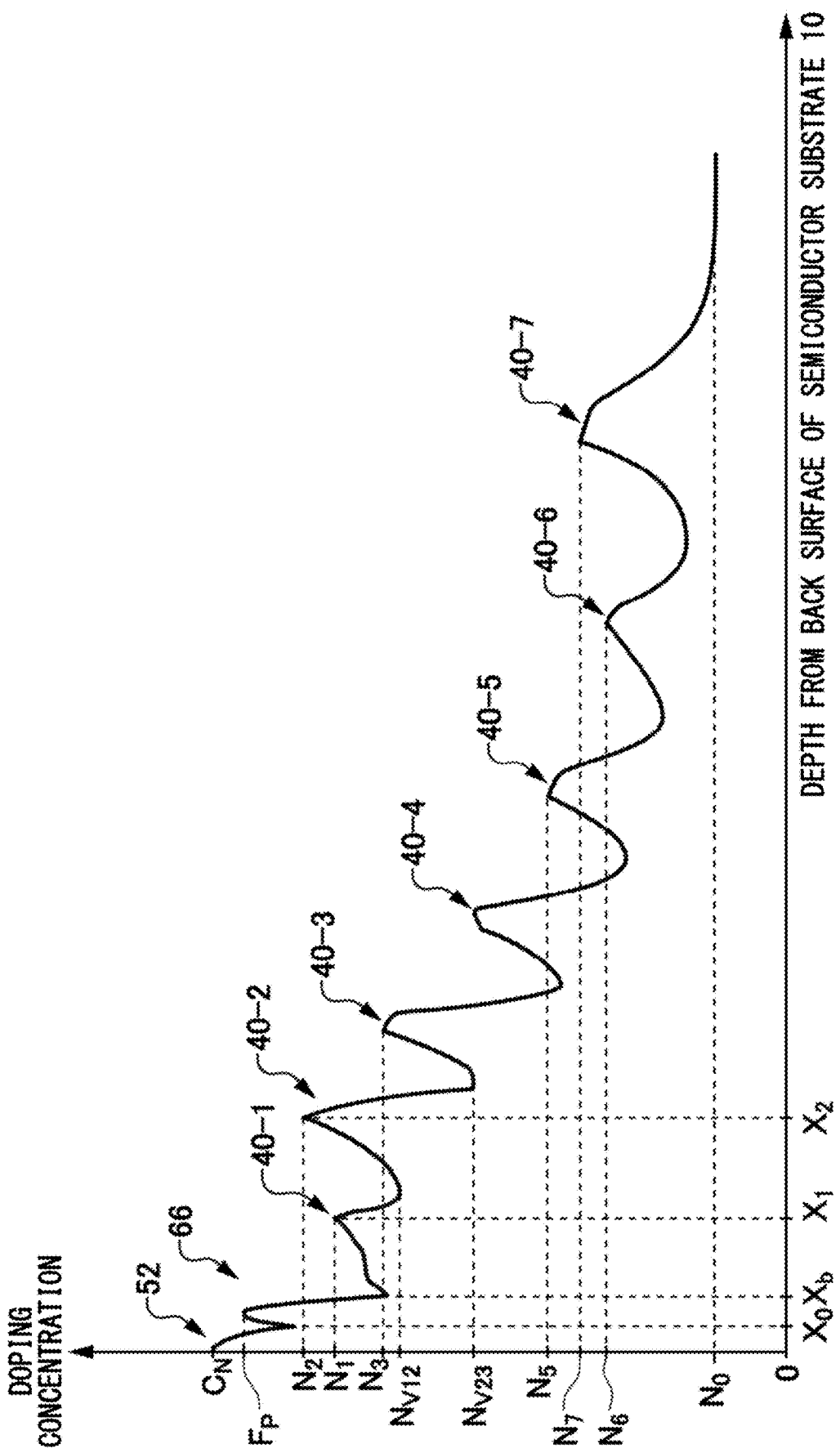
FIG. 6D shows one example of a doping concentration distribution of a semiconductor substrate 10 having a floating layer 66.

FIG. 6D shows one example of a doping concentration distribution of a semiconductor substrate 10 having a floating layer 66. The doping concentration distribution of the present example is different from the doping concentration distribution according to FIG. 6A in that a distance $X_b$ of a boundary position between the peak 40-1 and the floating layer 66 from the back surface of the semiconductor substrate 10 is smaller than a distance $X_1-X_b$ between the peak 40-1, and a boundary position between the peak 40-1 and the floating layer 66. That is, $X_b<X_1-X_b$ holds. This can easily stop extension of the depletion layer from the upper surface side of the semiconductor substrate 10 in the peak 40-1.

Figure 7:
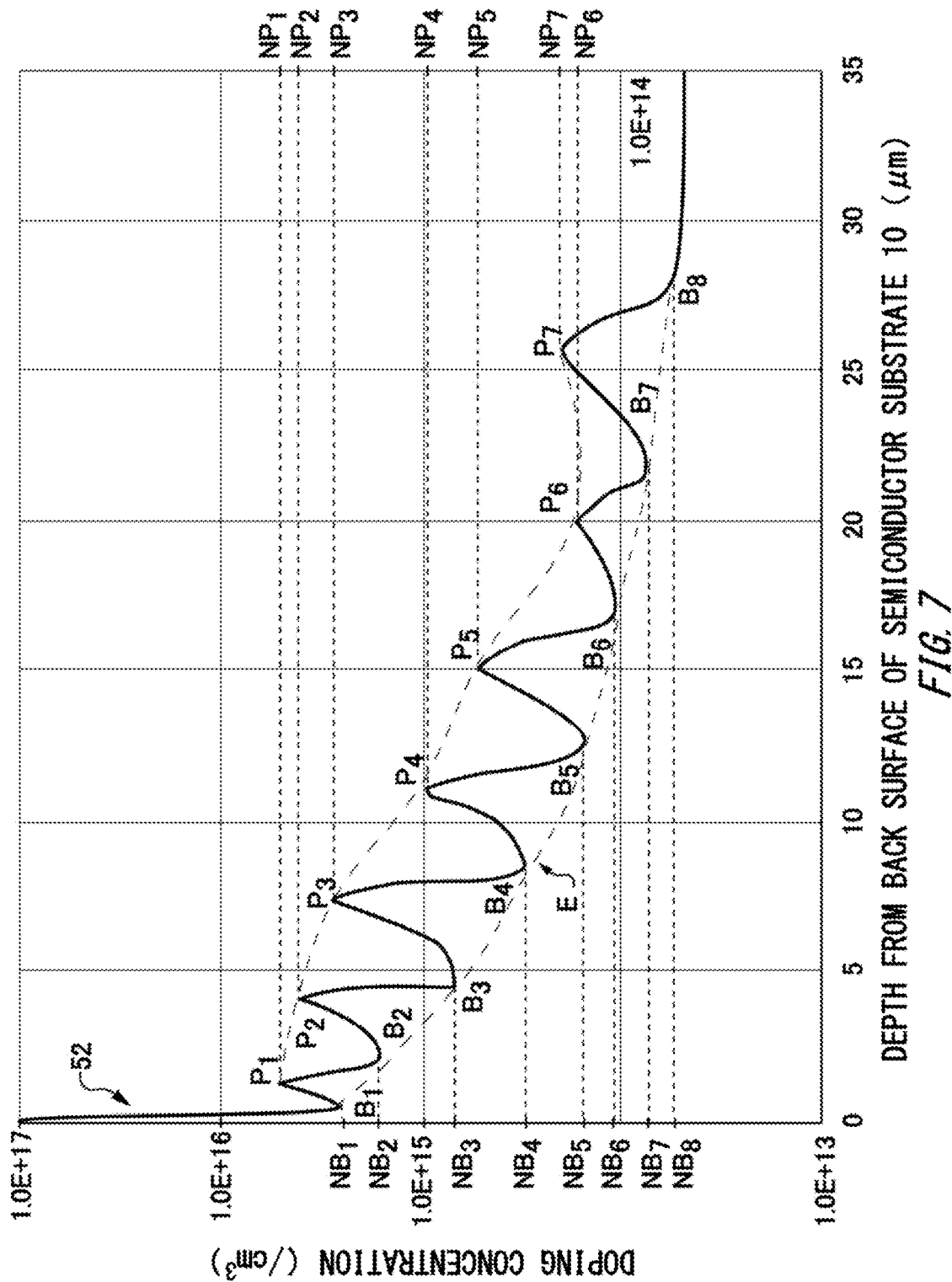
FIG. 7 shows one example of a more detailed doping concentration distribution of a semiconductor substrate 10 according to an embodiment.

FIG. 7 shows one example of a more detailed doping concentration distribution of a semiconductor substrate 10 according to an embodiment. The doping concentration distribution of the present example shows the doping concentration distribution in the depth direction of the semiconductor substrate 10 in the transistor section 50. For this reason, the doping concentration of the collector region 52 is shown at the back surface side of the semiconductor substrate 10.

The buffer region 20 of the present example has n peaks $P_1$-$P_n$ (n is an integer greater than or equal to 2) in the doping concentration distribution. Among n peaks $P_1$-$P_n$, a doping concentration of the i-th peak $P_i$ from the back surface side of the semiconductor substrate 10 is a doping concentration $NP_i$. In the present example, the case for n=7 is shown.

However, the present invention is not limited to this case. Note that, i is an integer greater than or equal to 1.

Also, the buffer region 20 has n+1 valleys $B_1$-$B_{n+1}$ in the doping concentration distribution. The valleys $B_1$-$B_n$ are provided closer to the back surface of the semiconductor substrate 10 than n peaks $P_1$-$P_n$ are. Also, $B_{n+1}$ is provided closer to the upper surface of the semiconductor substrate 10 than the nth peak $P_n$ is. Among the n+1 valleys $B_1$-$B_{n+1}$, a doping concentration of the i-th valley $B_i$ from a back surface side of the semiconductor substrate 10 is a doping concentration $NB_i$. The doping concentration $NB_{n+1}$ of the n+1th valley $B_{n+1}$ may be the same as the doping concentration of the drift region 14.

Here, the buffer region 20 of the present example has a pair of a peak and a valley with $NP_i/NB_{i+1} \leq 10$. That is, the doping concentration $NP_i$ of the i-th peak $P_i$ may be 10 times or less a doping concentration $NB_{i+1}$ of the first valley $B_{i+1}$ closer to the upper surface of the semiconductor substrate 10 than the peak $P_i$ is. In this manner, by making the doping concentration ratio of a doping concentration $NP_i$ of the peak $P_i$ to the doping concentration $NB_{i+1}$ of the first valley $B_{i+1}$ closer to the upper surface of the semiconductor substrate 10 than the peak $P_i$ is 10 times or less, the spreading of a space charge region while the semiconductor device is turned off and at the time of reverse recovery can be made smooth. This achieves soft switching of the semiconductor device 100.

Also, the buffer region 20 may have a plurality of the pairs of a peak and a valley satisfying $NP_i/NB_{i+1} \leq 10$. For example, there are four or more pairs of peaks $P_i$ and valleys $B_{i+1}$ with $NP_i/NB_{i+1} \leq 10$. Also, there may also be five or more pairs of peaks $P_i$ and valleys $B_{i+1}$ with $NP_i/NB_{i+1}$ $10. Note that, the present example has been described as $NP_i/NB_{i+1} \leq 10$, but the condition may be $NP_i/NB_{i+1} < 10$.

The valley $B_1$ is a valley which is the closest to the back surface side of the semiconductor substrate 10. If the semiconductor device 100 is the IGBT, the boundary between valley $B_1$ and the p-type collector region 52 is a p-n junction. For this reason, the doping concentration of the shallowest valley $B_1$ is theoretically zero. Therefore, with respect to the doping concentration of the valley $B_1$ at a boundary sandwiched by different conductivity type regions in this manner, a donor concentration (or acceptor concentration) at a position where a donor concentration of an n-type region (the valley $B_1$ of the buffer region 20 in the present example) and an acceptor concentration of a p-type region (the collector region 52 in the present example) are the same concentration, may be a doping concentration $NB_1$ of the valley $B_1$.

In the electric field strength distribution in the space charge region, the decrease in the electric field strength at a given depth position is determined based on the doping concentration $NP_i$ of the peak $P_i$ and the arrangement of the peak $P_i$. On the other hand, the decrease in the average electric field strength in the entire depth direction of the semiconductor substrate 10 is determined based on the doping concentration $NB_i$ of the valley $B_i$ and the arrangement of the valley $B_i$ in addition to the doping concentration $NP_i$ of the peak $P_i$. That is, if the applied voltage is high, and the collector-emitter voltage (or the cathode-anode voltage) is high, not only the doping concentration of the peak but also the doping concentration of the valley and its distribution and arrangement contribute to the extent of suppressing the spreading of the space charge region.

Therefore, an envelope E connecting all of doping concentrations $NB_i$ of the valley $B_i$ preferably attenuates moderately. For example, an envelope E preferably attenuates from valley $B_1$ to valley $B_{n+1}$ exponentially or more moderately than an exponential function. Also, the envelope E may attenuate with a distribution rather than an exponential function than the Gaussian function. The envelope E may show a distribution that is convex toward the side at which the doping concentration is low (the lower side of the graph), when the vertical axis is a logarithmic scale and the horizontal axis is a linear scale. This can gradually increase the suppressing of the spreading of the space charge region while the semiconductor device is turned off and at a time of reverse recovery toward the back surface of the semiconductor substrate 10 (that is, the collector region 52 or the cathode region 64). Accordingly, the switching waveform of the semiconductor device 100 becomes smooth, and soft switching of the semiconductor device 100 is achieved.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated explicitly by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
 a drift region of a first conductivity type provided in a semiconductor substrate; and
 a buffer region of the first conductivity type, the buffer region including at least six peaks in a doping concentration distribution in a depth direction of the semiconductor substrate, a curve connecting the at least six peaks including an upwardly-convex portion.

2. The semiconductor device according to claim 1, wherein
 the at least six peaks in the doping concentration distribution of the buffer region include a first peak positioned closest to a back surface of the semiconductor substrate, an upper-surface-side peak positioned closest to the drift region, and a plurality of intermediate peaks positioned between the first peak and the upper-surface-side peak, and
 a doping concentration of the buffer region is higher than a doping concentration of the drift region.

3. The semiconductor device according to claim 2, wherein
 one peak of the plurality of intermediate peaks has a highest doping concentration in the doping concentration distribution of the buffer region.

4. The semiconductor device according to claim 2, wherein
 among the plurality of intermediate peaks, an intermediate peak positioned closest to the back surface of the semiconductor substrate has a highest doping concentration in the doping concentration distribution of the buffer region.

5. The semiconductor device according to claim 1, wherein the upwardly-convex portion is a part of the curve connecting the at least six peaks.

6. The semiconductor device according to claim 1, wherein
in the doping concentration distribution, a curve connecting five peaks among the at least six peaks includes the upwardly-convex portion.

7. The semiconductor device according to claim 2, wherein
the upwardly-convex portion is formed by a curve connecting the first peak and the plurality of intermediate peaks.

8. The semiconductor device according to claim 2, wherein
a doping concentration of the upper-surface-side peak is higher than a doping concentration of an intermediate peak positioned closest to the drift region among the plurality of intermediate peaks.

9. The semiconductor device according to claim 2, wherein
a doping concentration of the first peak is higher than a doping concentration of any one peak of the upper-surface-side peak and the plurality of intermediate peaks.

10. The semiconductor device according to claim 2, wherein
a doping concentration of the first peak and a doping concentration of an intermediate peak positioned closest to the back surface of the semiconductor substrate among the plurality of intermediate peaks are not smaller than $1E15$ $cm^{-3}$ and not greater than $1E16$ $cm^{-3}$.

11. The semiconductor device according to claim 1, wherein
the buffer region includes hydrogen.

12. The semiconductor device according to claim 1, wherein
the at least six peaks are based on hydrogen-induced donors.

13. The semiconductor device according to claim 1, further comprising a trench provided at an upper surface side of the semiconductor substrate.

14. The semiconductor device according to claim 1, wherein
the at least six peaks in the doping concentration distribution of the buffer region includes at least seven peaks.

15. The semiconductor device according to claim 1, wherein
the semiconductor device is a diode having a cathode region of the first conductivity type provided at a back surface side of the semiconductor substrate.

16. The semiconductor device according to claim 2, wherein
the semiconductor device is an IGBT having a collector region of a second conductivity type provided at a back surface side of the semiconductor substrate.

17. The semiconductor device according to claim 16, wherein
in the depth direction of the semiconductor substrate, a distance from the back surface of the semiconductor substrate to a boundary between the first peak and the collector region is smaller than a distance from the boundary between the first peak and the collector region to the first peak.

18. The semiconductor device according to claim 2, wherein
the semiconductor device includes a transistor portion and a diode portion.

19. A semiconductor device comprising:
a drift region of a first conductivity type provided in a semiconductor substrate; and
a buffer region of the first conductivity type, the buffer region including at least five peaks in a doping concentration distribution in a depth direction of the semiconductor substrate, a shape of a curve connecting the at least five peaks being upwardly-convex.

* * * * *